United States Patent
Hara et al.

(10) Patent No.: US 11,011,403 B2
(45) Date of Patent: May 18, 2021

(54) TRANSPORT CONTAINER AUTOMATIC CLAMPING MECHANISM

(71) Applicants: NATIONAL INSTITUTE OF ADVANCED INDUSTRIAL SCIENCE AND TECHNOLOGY, Tokyo (JP); DESIGN NETWORK CO., LTD., Tokyo (JP)

(72) Inventors: Shiro Hara, Ibaraki (JP); Hitoshi Maekawa, Ibaraki (JP); Hiroyuki Nishihara, Tokyo (JP); Koji Sagisawa, Tokyo (JP)

(73) Assignees: NATIONAL INSTITUTE OF ADVANCED INDUSTRIAL SCIENCE AND TECHNOLOGY, Tokyo (JP); DESIGN NETWORK CO., LTD., Tokyo (JP)

( * ) Notice: Subject to any disclaimer, the term of this patent is extended or adjusted under 35 U.S.C. 154(b) by 289 days.

(21) Appl. No.: 16/182,891

(22) Filed: Nov. 7, 2018

(65) Prior Publication Data
US 2019/0164797 A1    May 30, 2019

(30) Foreign Application Priority Data

Nov. 30, 2017  (JP) .............................. JP2017-230318

(51) Int. Cl.
H01L 21/677   (2006.01)
H01L 21/673   (2006.01)
H01L 21/687   (2006.01)

(52) U.S. Cl.
CPC .... *H01L 21/67766* (2013.01); *H01L 21/6773* (2013.01); *H01L 21/67379* (2013.01);
(Continued)

(58) Field of Classification Search
CPC .... B25B 1/00; B25B 1/02; B25B 1/04; B25B 1/24; B25B 5/00; B25B 5/02; B25B 5/04;
(Continued)

(56) References Cited

U.S. PATENT DOCUMENTS 6,138,726 A * 10/2000 Newman ................ B23Q 3/007
                                                  144/144.1
8,393,605 B2 * 3/2013 Yang ....................... B25B 5/003
                                                  269/287

(Continued)

FOREIGN PATENT DOCUMENTS

JP   2011-258722   12/2011
JP   2016-111032    6/2016

*Primary Examiner* — Lee D Wilson
(74) *Attorney, Agent, or Firm* — Staas & Halsey LLP

(57) ABSTRACT

An automatic clamping mechanism capable of automatically securing and releasing a wafer transport container to or from a manufacturing apparatus and having a small height dimension is provided at low cost. A wafer transport container is placed on a container placing table. A semiconductor wafer is loaded into the manufacturing apparatus main body from a wafer loading port while being placed on a container base part of the wafer transport container. An automatic clamping mechanism generates a press force component in a vertical direction at the wafer transport container and secures the wafer transport container to the container placing table by bringing claw parts of a plurality of clamping claws into contact with an inclined contact surface provided on a container lid part of the wafer transport container and pressing the inclined contact surface in a substantially horizontal direction.

11 Claims, 8 Drawing Sheets

(52) U.S. Cl.
CPC .. *H01L 21/67772* (2013.01); *H01L 21/67775* (2013.01); *H01L 21/68707* (2013.01)

(58) Field of Classification Search
CPC .......... B23P 11/00; B23P 11/027; B23Q 3/00; B23Q 3/06; B23Q 3/02; H01L 21/67766; H01L 21/6773
See application file for complete search history.

(56) References Cited

U.S. PATENT DOCUMENTS

| | | |
|---|---|---|
| 9,016,501 B2 | 4/2015 | Hare et al. |
| 2019/0164797 A1* | 5/2019 | Hara ................... H01L 21/6773 |

* cited by examiner

TRANSPORT CONTAINER AUTOMATIC CLAMPING MECHANISM

CROSS-REFERENCE TO RELATED APPLICATION

This application claims the benefit of Japanese Patent Application No. 2017-230318, filed on Nov. 30, 2017, in the Japanese Intellectual Property Office, the disclosure of which is incorporated herein by reference.

BACKGROUND OF THE INVENTION

Field of the Invention

The present invention relates to an automatic clamping mechanism for automatically securing a transport container storing a processing substrate to a container placing part of a manufacturing apparatus. The invention can be applied to, for example, a mechanism for securing a wafer transport container storing a semiconductor wafer to a container placing table of a compact semiconductor manufacturing apparatus.

Description of the Related Art

Conventionally, semiconductor manufacturing technologies have attempted to reduce the unit cost of manufacturing chips by increasing the wafer diameter. Consequently, the sizes and prices of apparatuses for use in a series of manufacturing processes have been increasing, resulting in an increase in the scale of manufacturing factories and the costs of construction and operation. Such a large-scale manufacturing system contributes to a reduction in the unit cost of manufacturing chips in the case of mass producing and a small number of product types, but it is difficult to respond to requests for small-lot production of a variety of types of products and to adjust the volume of production according to market conditions, and it is also difficult for small and medium sized companies to enter.

In order to solve these problems, a compact inexpensive semiconductor manufacturing apparatus capable of manufacturing a semiconductor chip at low cost using a small-diameter wafer (for example, a wafer having a diameter of 12.5 mm) is desired. In a manufacturing line using such compact semiconductor manufacturing apparatuses, a plurality of semiconductor manufacturing apparatuses are arranged on the floor surface, and a wafer transport container storing one piece of small-diameter wafer is transported between the plurality of semiconductor manufacturing apparatuses (see, for example, Japanese Patent Application Laid-Open No. 2011-258722).

In order to efficiently carry out a series of manufacturing processes for a small-diameter wafer on such a manufacturing line including a plurality of semiconductor manufacturing apparatuses, it is desired to automatically transport the wafer transport container between the plurality of semiconductor manufacturing apparatuses (see, for example, Japanese Patent Application Laid-Open No. 2016-111032).

When a semiconductor manufacturing apparatus receives a wafer transport container from a semiconductor manufacturing apparatus of a preceding step, the semiconductor manufacturing apparatus must load a small-diameter wafer in the wafer transport container into the main body of the semiconductor manufacturing apparatus while the wafer transport container is being secured to the upper part of the apparatus antechamber. Further, after returning the small-diameter wafer which has been processed in the main body of the semiconductor manufacturing apparatus to the wafer transport container from the apparatus antechamber, the securing of the transport container to the apparatus antechamber must be released to deliver the wafer transport container to a semiconductor manufacturing apparatus of the next step.

An object of the invention is to provide a compact automatic clamping mechanism capable of automatically securing and releasing a processing-substrate transport container to or from a manufacturing apparatus at low cost.

SUMMARY OF THE INVENTION

An invention according to claim 1 is a transport container automatic clamping mechanism that is mounted in a manufacturing apparatus including a container placing part on which a transport container which transports a processing substrate is placed; and a loading port provided at a central portion of the container placing part to load the processing substrate into a main body of the manufacturing apparatus from a base side of the transport container on the container placing part by lowering the processing substrate, and secures the transport container to the container placing part, the transport container automatic clamping mechanism including: a plurality of clamping claws configured to generate a press force component in a vertical direction at the transport container and secure the transport container to the container placing part by contacting and pressing an edge portion of the transport container in a substantially horizontal direction; and a clamping control mechanism configured to move the plurality of clamping claws substantially horizontally in a direction approaching the transport container to contact and press the edge portion when the transport container is placed on the container placing part.

In addition to the configuration of claim 1, the invention according to claim 2 is characterized in that the clamping control mechanism separates the plurality of clamping claws from the edge portion by moving the clamping claws substantially horizontally in a direction away from the transport container after the processing substrate is returned into the transport container from the main body of the manufacturing apparatus.

In addition to the configuration of claim 1, the invention according to claim 3 is characterized in that an inclined surface is formed on the edge portion of the transport container, and the plurality of clamping claws generate the press force component in the vertical direction at the transport container by pressing the inclined surface in a substantially horizontal direction.

In addition to the configuration of claim 1, the invention according to claim 4 is characterized in that the container placing part is provided with an O-ring surrounding the loading port, whereby opposing surfaces of the transport container and the container placing part are sealed when the plurality of clamping claws press the transport container.

In addition to the configuration of claim 1, the invention according to claim 5 is characterized in that the clamping control mechanism includes a link mechanism including: a substantially L-shaped first arm having one or a plurality of the clamping claws at one end portion and capable of horizontally moving in a direction in which the clamping claw approaches the transport container and a direction in which the clamping claw moves away from the transport container; and a second arm having one end rotatably connected to a vicinity of another end of the first arm, and another end on which another of the clamping claws is mounted, and rotating about a rotation shaft provided at a substantially central portion, and when the clamping claw mounted on the first arm comes into contact with the edge portion of the transport container, the clamping claw mounted on the second arm also comes into contact with the edge portion of the transport container.

According to the invention of claim 1, since the press force component in the vertical direction is generated at the transport container to secure the transport container to the container placing part by moving the plurality of clamping claws in the substantially horizontal direction and pressing the edge portion of the transport container substantially horizontally, it is possible to reduce the height dimension and downsize the automatic clamping mechanism, and it is also possible to provide the automatic clamping mechanism at very low cost.

According to the invention of claim 2, the securing to the container placing part can be released by just moving the clamping claw in the substantially horizontal direction to separate the clamping claw from the edge portion of the transport container.

According to the invention of claim 3, since the inclined surface is formed on the edge portion of the transport container and the plurality of clamping claws press the inclined surface in the substantially horizontal direction, it is possible to generate the press force component in the vertical direction at the edge portion of the transport container by a compact and inexpensive configuration.

According to the invention of claim 4, it is possible to simultaneously secure the transport container to the container placing part and seal the opposing surfaces of the transport container and the container placing part by the plurality of clamping claws.

According to the invention of claim 5, with a simple configuration, it is possible to move the clamping claws substantially horizontally and secure the transport container to the container placing part.

BRIEF DESCRIPTION OF THE DRAWINGS

FIGS. 3A-3C are views showing a configuration of an automatic clamping mechanism according to Embodiment 1 of the invention, wherein FIG. 3A is an exterior plan view, FIG. 3B is a side view, and FIG. 3C is an internal structure plan view.

FIGS. 6A, 6B are A-A sectional views of FIG. 3A, wherein FIG. 6A shows a state in which the transport container is secured, and FIG. 6B shows a state in which the securing of the transport container is released.

FIGS. 7A-7C are views showing the structure of a clamping claw according to Embodiment 1 of the invention, wherein FIG. 7A is a plan view, FIG. 7B is a side view, and FIG. 7C is a perspective view.

DETAILED DESCRIPTION OF THE PREFERRED EMBODIMENT

Embodiment 1

The following will describe Embodiment 1 of the invention by giving an example in which the invention is applied to an automatic clamping mechanism of a compact semiconductor manufacturing apparatus.

Figure 1:
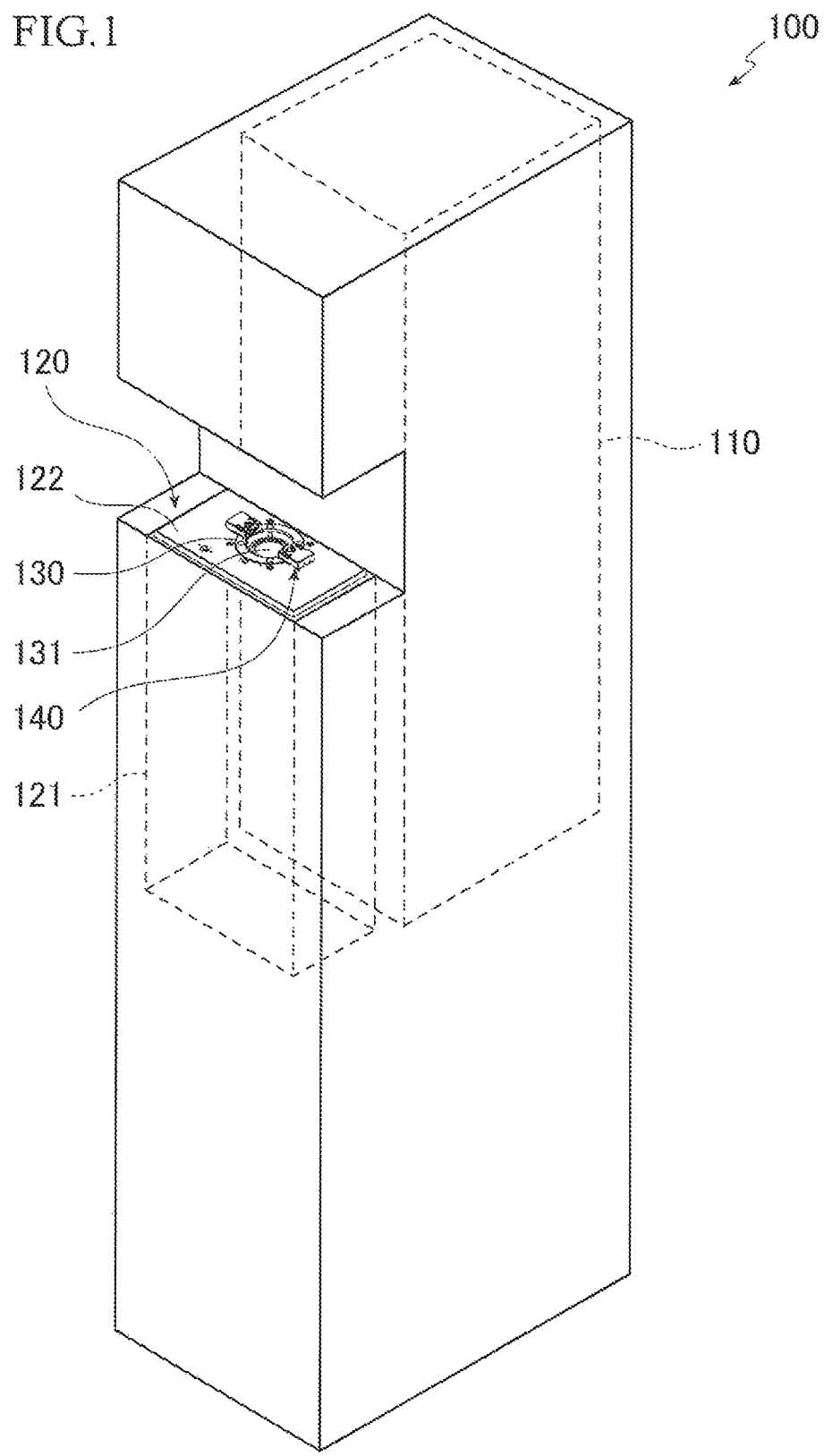
FIG. 1 is a perspective view conceptually showing an overall configuration of a compact semiconductor manufacturing apparatus according to Embodiment 1 of the invention.

As shown in FIG. 1, a compact semiconductor manufacturing apparatus 100 according to Embodiment 1 includes a processing chamber 110 and an apparatus antechamber 120. The processing chamber 110 and the apparatus antechamber 120 are configured to be separable. Therefore, it is possible to standardize the apparatus antechamber 120 for compact semiconductor manufacturing apparatuses having different types of processing chambers 110, and consequently the manufacturing cost of a semiconductor manufacturing system as a whole can be reduced.

The processing chamber 110 receives a semiconductor wafer from the apparatus antechamber 120 through a wafer loading port (not shown). Then, known processing (for example, film formation, etching, inspection processes, etc.) is performed on the semiconductor wafer. A detailed description of the processing chamber 110 is omitted. In Embodiment 1, a small-diameter wafer having a diameter of 20 mm or less (for example, 12.5±0.2 mm) is used as the semiconductor wafer.

On the other hand, the apparatus antechamber 120 is a room for taking out a semiconductor wafer 300 stored in a wafer transport container 200 (see FIG. 2) and transporting the semiconductor wafer 300 to the processing chamber 110.

The apparatus antechamber 120 has an antechamber main body 121, a top plate 122, a control unit (not shown), etc. The top plate 122 is provided with a container placing table 130 for placing the wafer transport container 200, an automatic clamping mechanism 140 for pressing and securing the placed wafer transport container 200, a manipulation pin 429 for manually manipulating the automatic clamping mechanism 140, a manipulation switch 430 for electrically manipulating the operation of the automatic clamping mechanism 140, and a manipulation button (not shown) for manipulating the compact semiconductor manufacturing apparatus 100.

Figure 3A:
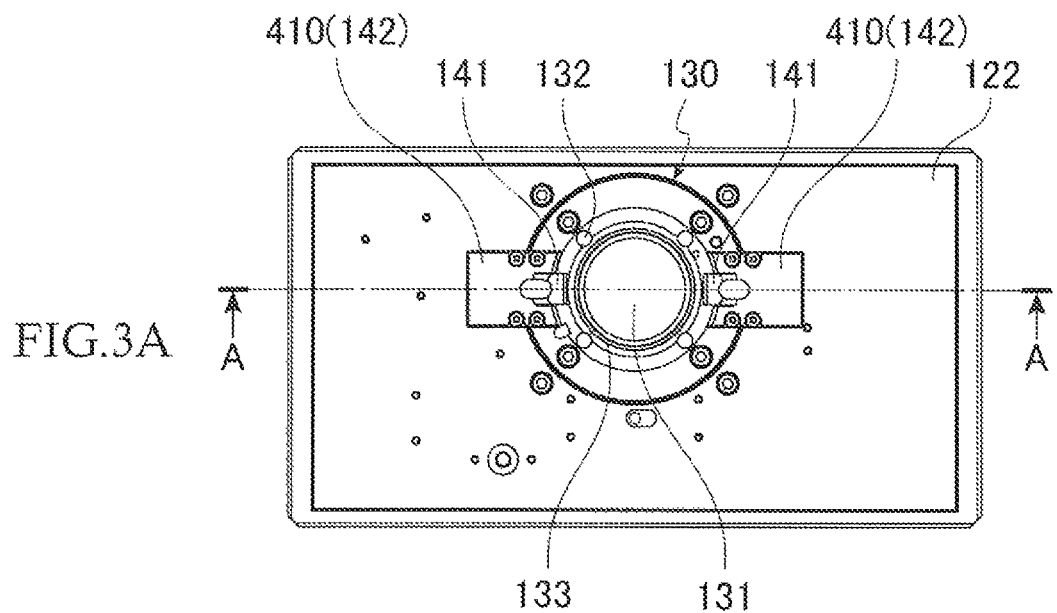
Figure 3B:
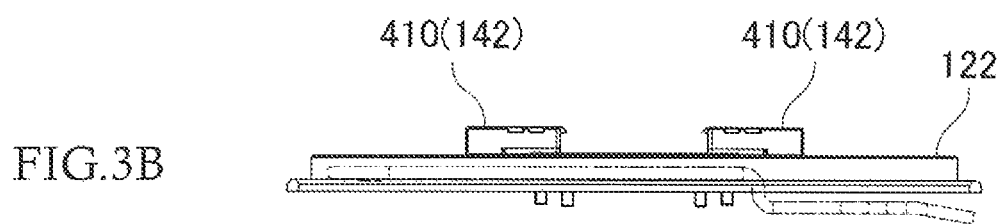
Figure 3C:
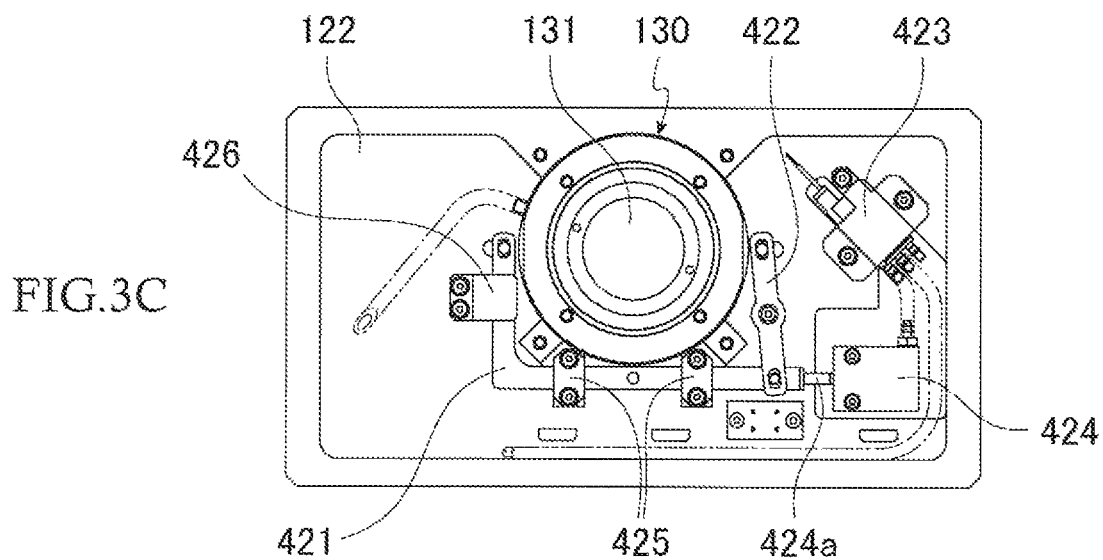
Figure 4:
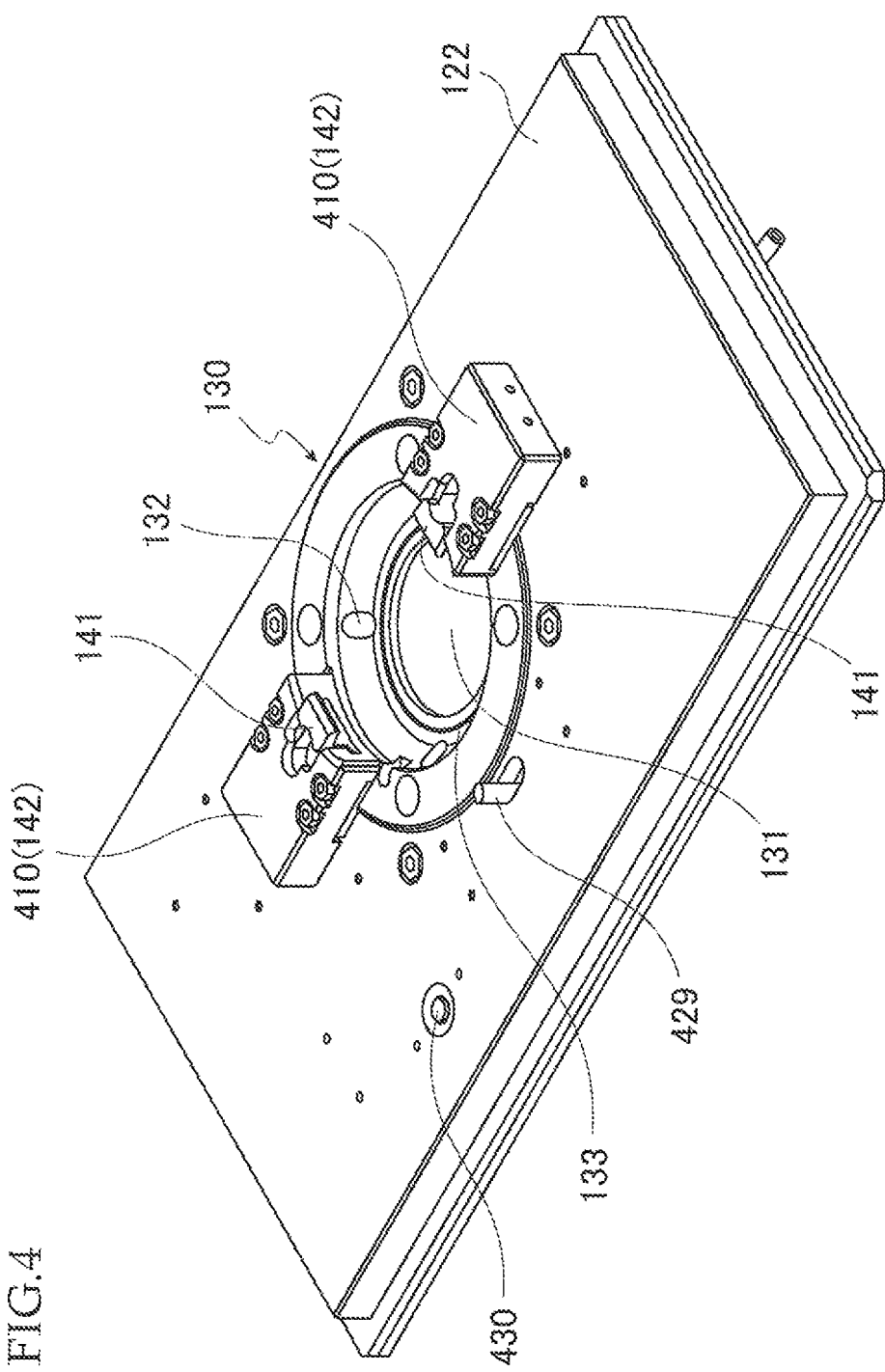
FIG. 4 is a perspective view showing the external structure of the automatic clamping mechanism according to Embodiment 1 of the invention.

Provided at a central portion of the container placing table 130 is a wafer loading port 131 for taking the semiconductor wafer 300 out of the wafer transport container 200 and loading the semiconductor wafer 300 into the antechamber main body 121. As shown in FIGS. 3A, 4 and 6, the inner side surface of the container placing table 130 is provided with, for example, four positioning recessed portions 132 for fitting positioning leg parts 203 (described later) of the wafer transport container 200. Further, an O-ring 133 is placed on the container placing table 130 to surround the wafer loading port 131.

The automatic clamping mechanism 140 presses the wafer transport container 200 horizontally from both sides thereof by a plurality of (two in this case) clamping claws 141. Then, the pressing force generates a press force component in a vertical direction at the wafer transport container 200, whereby the wafer transport container 200 is secured to the container placing table 130, and the opposing surfaces of the wafer transport container 200 and the container placing table 130 are sealed. The details of the automatic clamping mechanism 140 will be described later.

Figure 2:
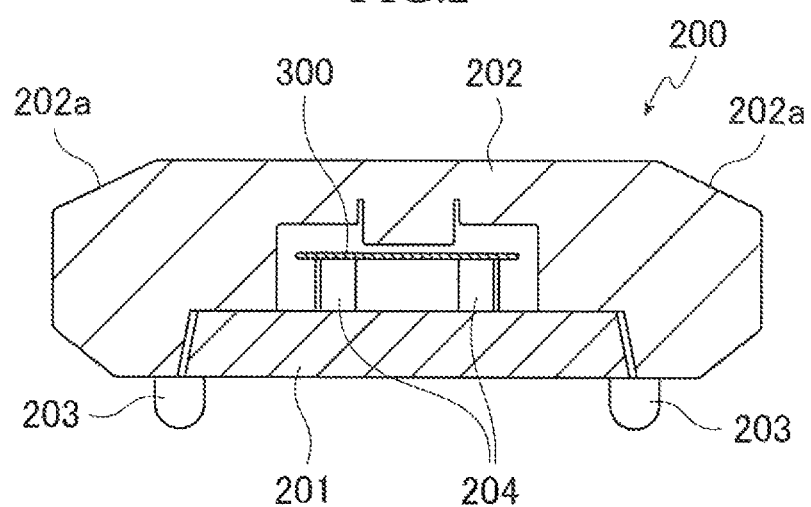
FIG. 2 is a cross-sectional view schematically showing an overall configuration of a transport container according to Embodiment 1 of the invention.

As shown in FIG. 2, the wafer transport container 200 includes a container base part 201, a container lid part 202, and positioning leg parts 203. On the upper surface of the container base part 201, for example, four pin members 204 for placing the semiconductor wafer 300 are provided.

The container base part 201 and the container lid part 202 are attracted to each other by, for example, weak attractive forces of permanent magnets (not shown), or the like provided on the container base part 201 and the container lid part 202, respectively. The semiconductor wafer 300 is loaded into the antechamber main body 121 of the apparatus antechamber 120 through the wafer loading port 131 while being kept on the pin members 204 of the container base part 201 (see, for example, Japanese Patent Laid-Open No. 2011-258722).

Here, an inclined contact surface 202a for contacting the clamping claw 141 (described later) is formed at an upper region of the edge portion of the container lid part 202. Since the surface with which the clamping claw 141 comes into contact is inclined, when the clamping claws 141 press substantially horizontally the wafer transport container 200, a press force component in a vertical direction is generated, and the wafer transport container 200 can be pressed against the container placing table 130 and secured.

The automatic clamping mechanism 140 according to Embodiment 1 will be described in detail below.

The automatic clamping mechanism 140 includes the clamping claws 141 and a clamping control mechanism 142.

Figure 6A:
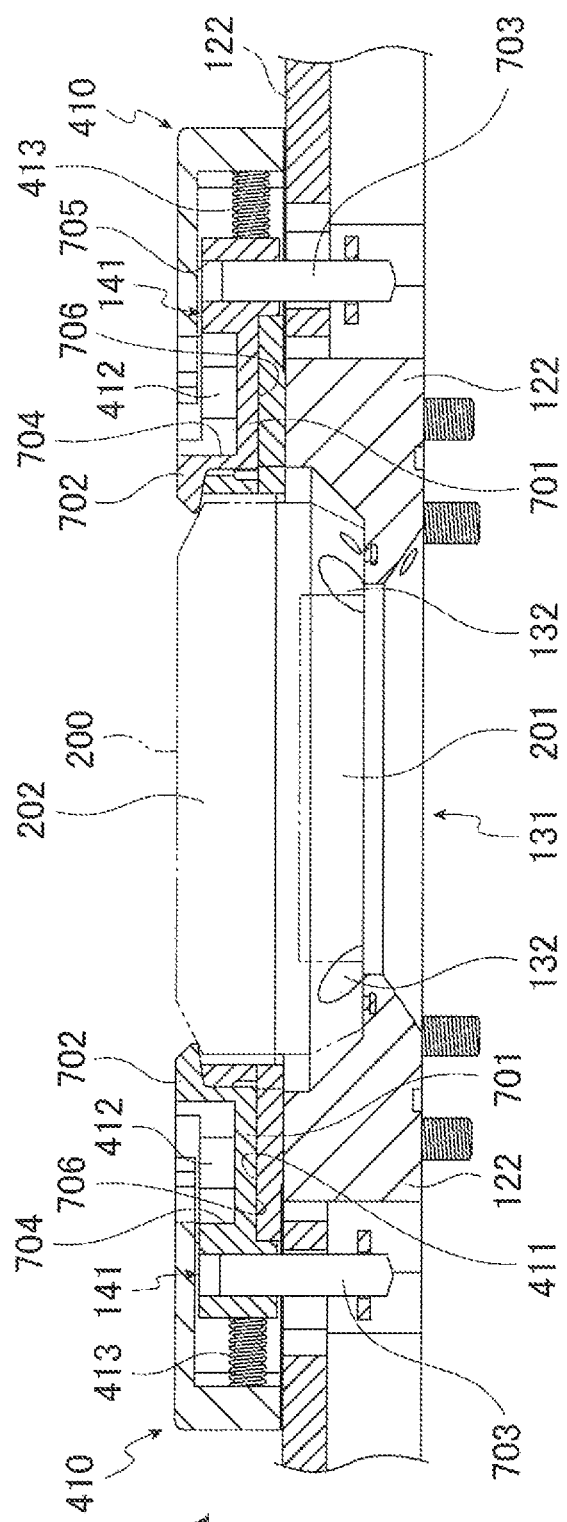
Figure 6B:
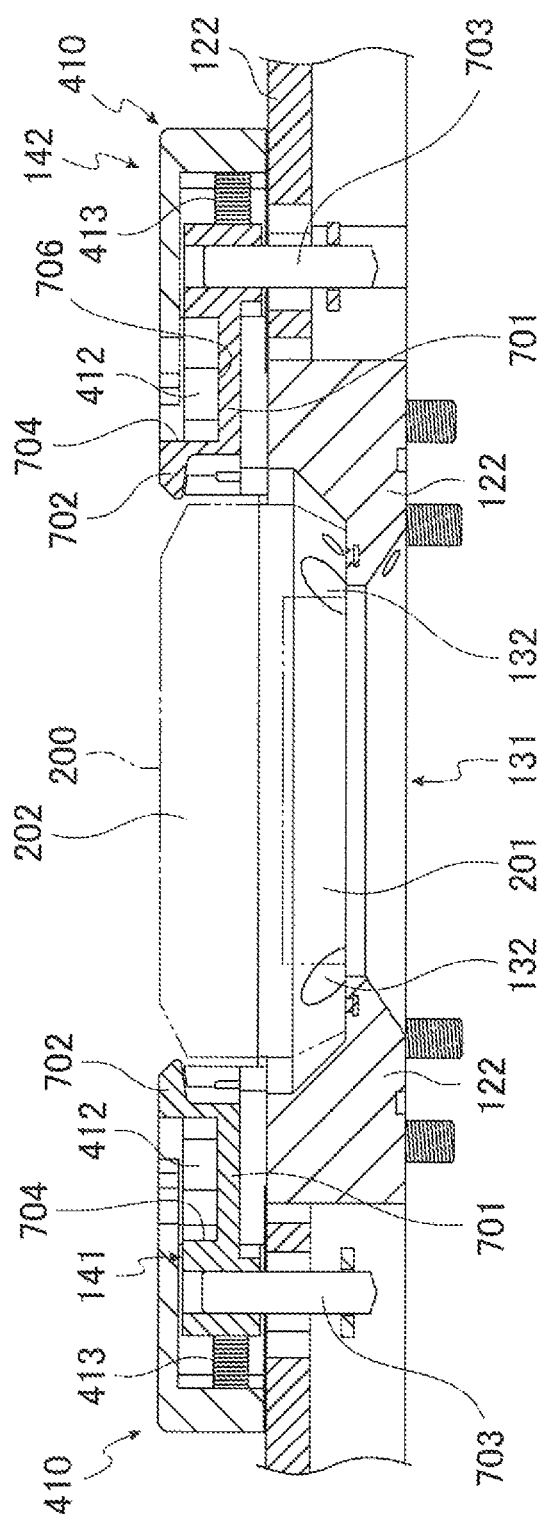
Figure 7A:
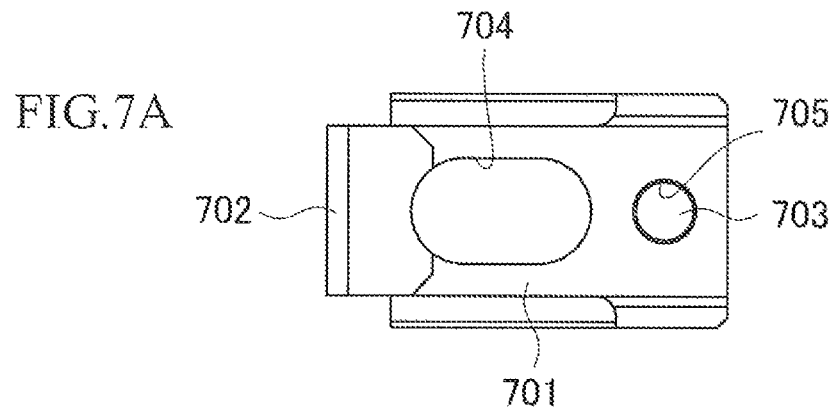
Figure 7B:
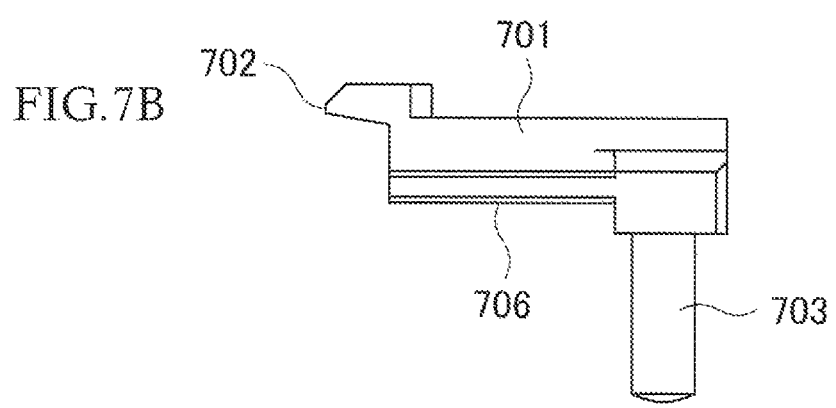
Figure 7C:
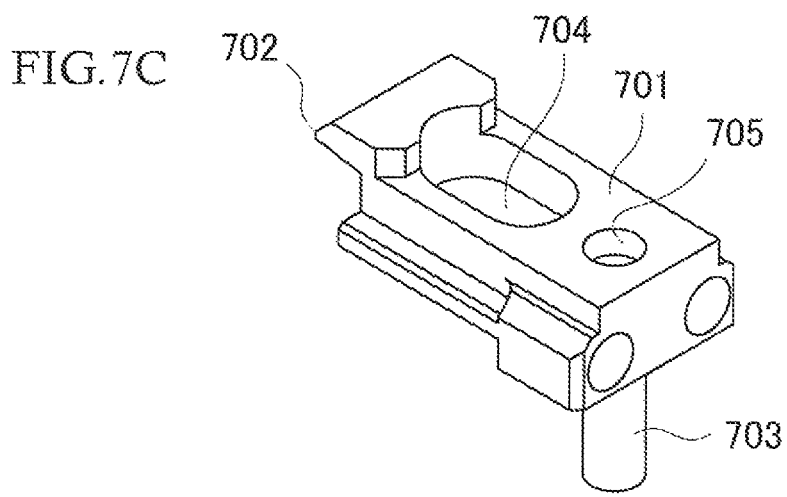

As shown in FIGS. 7A-7C, the clamping claw 141 includes a body part 701, a claw part 702 for contacting the container lid part 202 of the wafer transport container 200, and a leg part 703. Moreover, formed in the body part 701 are an elongated hole 704 for inserting a guide pin 412 (see FIGS. 6A, 6B) of a clamping claw storing part 410, and a round hole 705 for press-fitting the leg part 703. Further, the base of the body part 701 is provided with a slide surface 706 for sliding on a guide plate 411 (see FIGS. 6A, 6B) of the clamping claw storing part 410.

The clamping control mechanism 142 includes a plurality of (two in Embodiment 1) clamping claw storing parts 410, and one link mechanism 420.

As shown in FIGS. 4, 6A and 6B, the clamping claw storing parts 410 are disposed on the top plate 122 of the apparatus antechamber 120 to hold the container placing table 130 from both the left and right sides. Each of the clamping claw storing parts 410 has the guide plate 411 and the guide pin 412. The slide surface 706 of the clamping claw 141 is configured to slide on the guide plate 411 with the guide pin 412 being inserted through the elongated hole 704 of the clamping claw 141.

Further, the clamping claw storing part 410 is provided with biasing means (a spring in this case) 413 to bias the clamping claw 141 in a direction approaching the container placing table 130.

With such a configuration, the link mechanism 420, which will be described later, moves the leg part 703 of the clamping claw 141 in a direction approaching the container placing table 130 (hereinafter referred to as the "advancing direction"), whereby the claw part 702 of the clamping claw 141 comes into contact with the inclined contact surface 202a of the wafer transport container 200 placed on the container placing table 130. On the other hand, when the link mechanism 420 moves the leg part 703 in a direction away from the container placing table 130 (hereinafter referred to as the "retreating direction"), the claw part 702 of the clamping claw 141 is separated from the inclined contact surface 202a of the wafer transport container 200 placed on the container placing table 130.

Here, the clamping claw storing parts 410 are disposed at mutually opposing positions so that when the two clamping claws 141 respectively come into contact with the inclined contact surface 202a and press the wafer transport container 200, the horizontal components of the pressing forces cancel each other. It should be noted that when three or more clamping claw storing parts 410 are provided, the positions of the clamping claw storing parts 410 are determined so that the horizontal components of the pressing forces to be applied to the wafer transport container 200 by each of the clamping claws 141 cancel each other.

Figure 5:
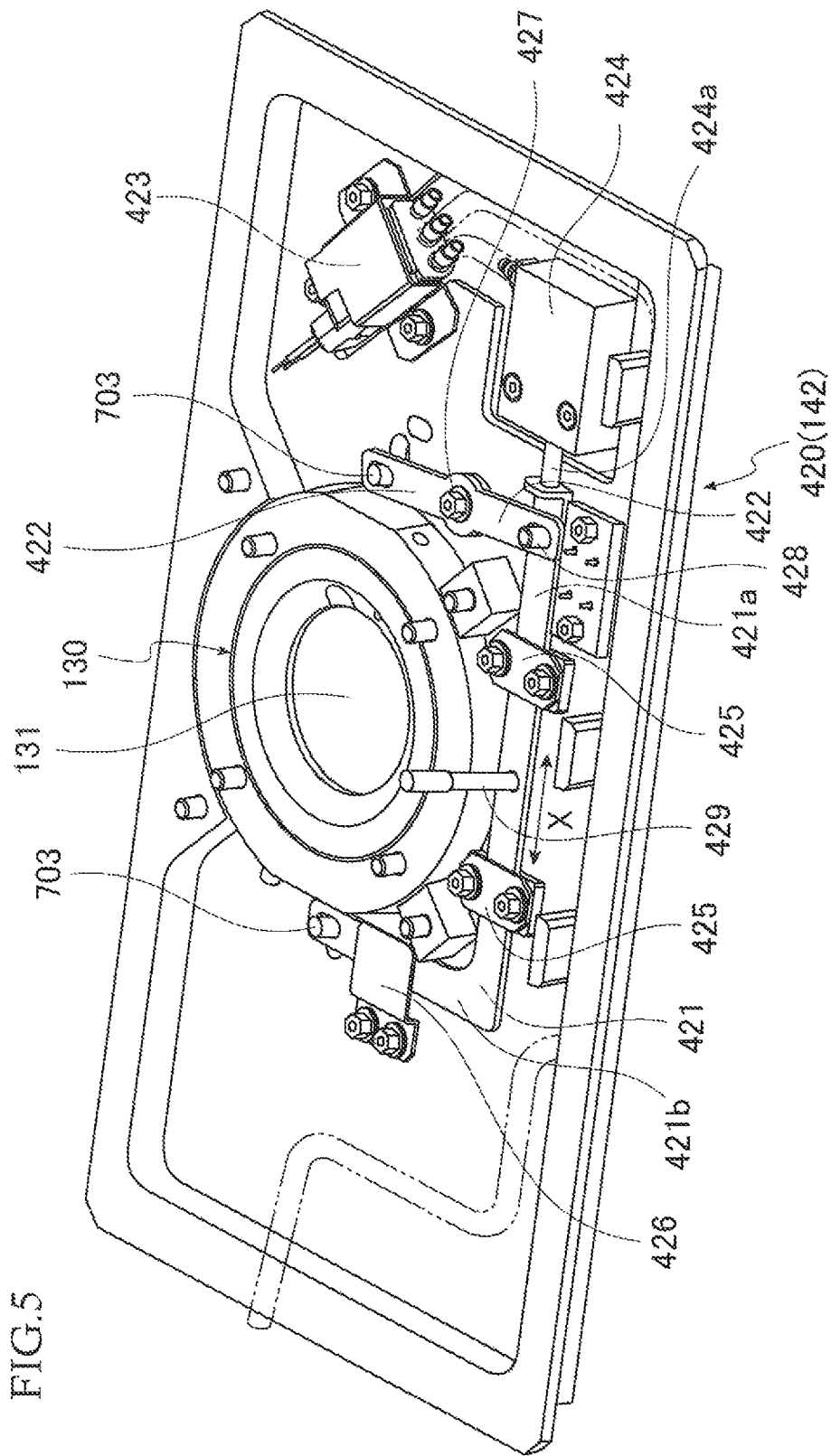
FIG. 5 is a perspective view showing the internal structure of the automatic clamping mechanism according to Embodiment 1 of the invention.

The link mechanism 420 is disposed under the top plate 122. As shown in FIG. 5, the link mechanism 420 includes a substantially L-shaped first arm 421, a substantially rectangular second arm 422, a solenoid valve 423, and an air cylinder 424.

A long part 421a of the first arm 421 is supported and guided by a plurality (two in this case) of guide members 425 so that the first arm 421 is movable in the X direction of FIG. 5. In addition, a pressing plate 426 prevents short part 421b of the first arm 421 from springing. The leg part 703 of one of the clamping claws 141 is connected to a distal end portion of the short part 421b. The manipulation pin 429 for manually moving the first arm 421 in the X direction is provided in a standing manner, for example, near the center of the long part 421a. The upper end portion of the manipulation pin 429 projects from the elongated hole of the top plate 122, and an operator can manually move the manipulation pin 429 in the X direction On the other hand, the second arm 422 rotates about a rotation shaft 427 provided at a substantially central portion of the second arm 422. One end portion of the second arm 422 is rotatably connected to a vicinity of an end portion of the long part 421a of the first arm 421 (the end portion away from the short part 421b) with the use of a connection pin 428. Further, the leg part 703 of the other clamping claw 141 is connected to the other end portion of the second arm 422.

The solenoid valve 423 executes the supply and exhaust of air to and from the air cylinder 424, according to a control signal input from a control unit (not shown) of the apparatus antechamber 120.

The air cylinder 424 extends a piston rod 424a when air is supplied from the solenoid valve 423, and the air cylinder 424 retracts the piston rod 424a when air is discharged by the solenoid valve 423.

According to such a configuration, when the solenoid valve 423 supplies air to the air cylinder 424, the piston rod 424a extends, and therefore the first arm 421 moves the leg part 703 of the clamping claw 141 in the retreating direction. At this time, the second arm 422 rotates clockwise, and therefore the second arm 422 moves the leg part 703 of the clamping claw 141 in the retreating direction. As a result, each claw part 702 of each clamping claw 141 is separated from the inclined contact surface 202a of the wafer transport container 200 (see FIG. 6B).

On the other hand, when the solenoid valve 423 discharges the air from the air cylinder 424, the piston rod 424a is retracted, and therefore the first arm 421 moves the leg part 703 of the clamping claw 141 in the advancing direction. At this time, since the second arm 422 rotates counterclockwise, the second arm 422 moves the leg part 703 of the clamping claw 141 in the advancing direction. As a result, each claw part 702 of each clamping claw 141 is in contact with the inclined contact surface 202a of the wafer transport container 200 (see FIG. 6A).

In addition, each claw part 702 of each clamping claw 141 can also be moved in the advancing and retreating directions by manipulating the manipulation pin 429 to move the first arm 421 in the X direction. The manipulation using the manipulation pin 429 is performed, for example, to retract the wafer transport container 200 from the container placing table 130 when the compact semiconductor manufacturing apparatus 100 has a trouble, or the like. It should be noted that the power source for moving the first arm 421 in the X direction is not necessarily a combination of the solenoid valve 423 and the air cylinder 424, and it is of course possible to use an electromagnetic motor or the like. However, in order to configure the automatic clamping mechanism 140 having a sufficiently small height dimension with the use of general-purpose parts, it is preferable to use the solenoid valve 423 and the air cylinder 424.

Next, the operation of the compact semiconductor manufacturing apparatus 100 according to Embodiment 1 will be described.

When the operation of the compact semiconductor manufacturing apparatus 100 is started and the wafer transport container 200 is to be placed on the container placing table 130, first, the control unit (not shown) of the apparatus antechamber 120 controls the solenoid valve 423 (see FIG. 5) of the automatic clamping mechanism 140 to supply air to the air cylinder 424. Consequently, the piston rod 424a of the air cylinder 424 extends, and the first arm 421 moves in the extending direction. As a result, the clamping claw 141 mounted on the first arm 421 moves in the retreating direction. Moreover, as the first arm 421 moves in the extending direction, the second arm 422 rotates clockwise about the rotation shaft 427 and accordingly the clamping claw 141 mounted on the second arm 422 also moves in the retreating direction.

As a result, a pair of the clamping claws 141 are both retracted from the positions on the container placing table 130, and the wafer transport container 200 can be readily placed on the container placing table 130.

Thereafter, the wafer transport container 200 (see FIG. 2) storing the semiconductor wafer 300 is placed on the container placing table 130 (see FIG. 4) of the top plate 122. At this time, by fitting the positioning leg part 203 of the wafer transport container 200 into the positioning recessed portion 132 formed on the inner surface of the wafer loading port 131, positioning of the wafer transport container 200 in the rotational direction is carried out. This placement can be performed by a container transport mechanism (described later) provided in the compact semiconductor manufacturing apparatus 100. However, it is of course possible to manually place the wafer transport container 200.

Next, the control unit (not shown) controls the solenoid valve 423 (see FIG. 5) of the automatic clamping mechanism 140 to exhaust the air in the air cylinder 424. Consequently, the piston rod 424a of the air cylinder 424 is retracted, and the first arm 421 moves in the retracted direction. As a result, the clamping claw 141 mounted on the first arm 421 moves in the advancing direction. Further, as the first arm 421 moves in the retracted direction, the second arm 422 rotates counterclockwise about the rotation shaft 427, and consequently the clamping claws 141 mounted on the second arm 422 also moves in the advancing direction.

As a result, both of the claw parts 702 of the pair of the clamping claws 141 come into contact with and press the inclined contact surface 202a of the wafer transport container 200 placed on the container placing table 130. Consequently, a press force is generated at the container lid part 202 of the wafer transport container 200, and the wafer transport container 200 is pressed against the container placing table 130 by the press force component in the vertical direction and secured (see FIG. 6A). At the same time, the base surface of the container lid part 202 of the wafer transport container 200 is pressed against the O-ring 133 on the container placing table 130 by the press force component in the vertical direction, whereby the opposing surfaces of the container lid part 202 and the container placing table 130 are sealed.

It should be noted that, in Embodiment 1, since the biasing means 413 is provided to bias the clamping claw 141, even when there is a slight error in the positional relationship (a positional deviation) between the position of the automatic clamping mechanism 140 and the set position of the wafer transport container 200, the wafer transport container 200 can be reliably secured by the clamping claws 141.

Subsequently, the semiconductor wafer 300 is lowered while being kept placed on the pin members 204 of the container base part 201 by a vertical transport mechanism (not shown). Hence, the semiconductor wafer 300 is loaded into the antechamber main body 121 of the apparatus antechamber 120 through the wafer loading port 131. At this time, the container lid part 202 of the wafer transport container 200 is secured to the container placing table 130 as it is by the clamping claws 141 of the automatic clamping mechanism 140 and hermetically closes the wafer loading port 131.

The semiconductor wafer 300 is transported from the apparatus antechamber 120 to the processing chamber 110 by a horizontal transport mechanism (not shown), and predetermined processing is performed. Upon completion of the processing, the semiconductor wafer 300 is returned to the apparatus antechamber 120 from the processing chamber 110 by the horizontal transport mechanism, and is then raised by the vertical transport mechanism while being placed on the pin members 204 of the container base part 201 and is again stored in the wafer transport container 200.

Next, the control unit of the apparatus antechamber 120 controls the solenoid valve 423 (see FIG. 5) of the automatic clamping mechanism 140 to supply air to the air cylinder 424. Consequently, the piston rod 424a of the air cylinder 424 extends, and the first arm 421 moves in the extending direction. As a result, the clamping claw 141 mounted on the first arm 421 moves in the retreating direction. Further, as the first arm 421 moves in the extending direction, the second arm 422 rotates clockwise about the rotation shaft 427, and accordingly the clamping claw 141 mounted on the second arm 422 also moves in the retreating direction.

Consequently, the pair of clamping claws 141 are both retracted from the positions on the container placing table 130, and the securing to the container placing table 130 by the clamping claws 141 is released. As a result, the wafer transport container 200 is ready to be removed from the container placing table 130.

It should be noted that, when the wafer transport container 200 is not placed on the container placing table 130 of the compact semiconductor manufacturing apparatus 100, it is desirable to maintain the pair of clamping claws 141 in a state in which the claw parts 702 are both advanced onto the container placing table 130. This prevents the wafer transport container 200 from being mistakenly placed on the compact semiconductor manufacturing apparatus 100.

As will be described later, in Embodiment 1, the wafer transport container 200 is automatically transported using container transport mechanisms 802A, 802B, 802C, and the automatic clamping mechanism 140 completely automatically secures and releases the wafer transport container 200 at predetermined timings. However, the operator of the compact semiconductor manufacturing apparatus 100 can also manipulate the automatic clamping mechanism 140 with the use of the manipulation switch 430.

In the case of using the manipulation switch 430, for example, air is supplied to the air cylinder 424 of the automatic clamping mechanism 140 while the manipulation switch 430 is being pressed, whereas when the manipulation switch 430 is not being pressed, air is exhausted from the air cylinder 424 of the automatic clamping mechanism 140.

Thus, while the manipulation switch 430 is kept pressed, the state in which the pair of clamping claws 141 are both retracted from the positions on the container placing table 130 and the wafer transport container 200 can be placed on the container placing table 130 is maintained, whereas, while the manipulation switch 430 is not being pressed, the state in which both of the claw parts 702 of the pair of clamping claws 141 are in contact with the wafer transport container 200 and secure the wafer transport container 200 is maintained. Next, an example of building a semiconductor manufacturing system using the compact semiconductor manufacturing apparatus 100 according to Embodiment 1 will be described.

Figure 8:
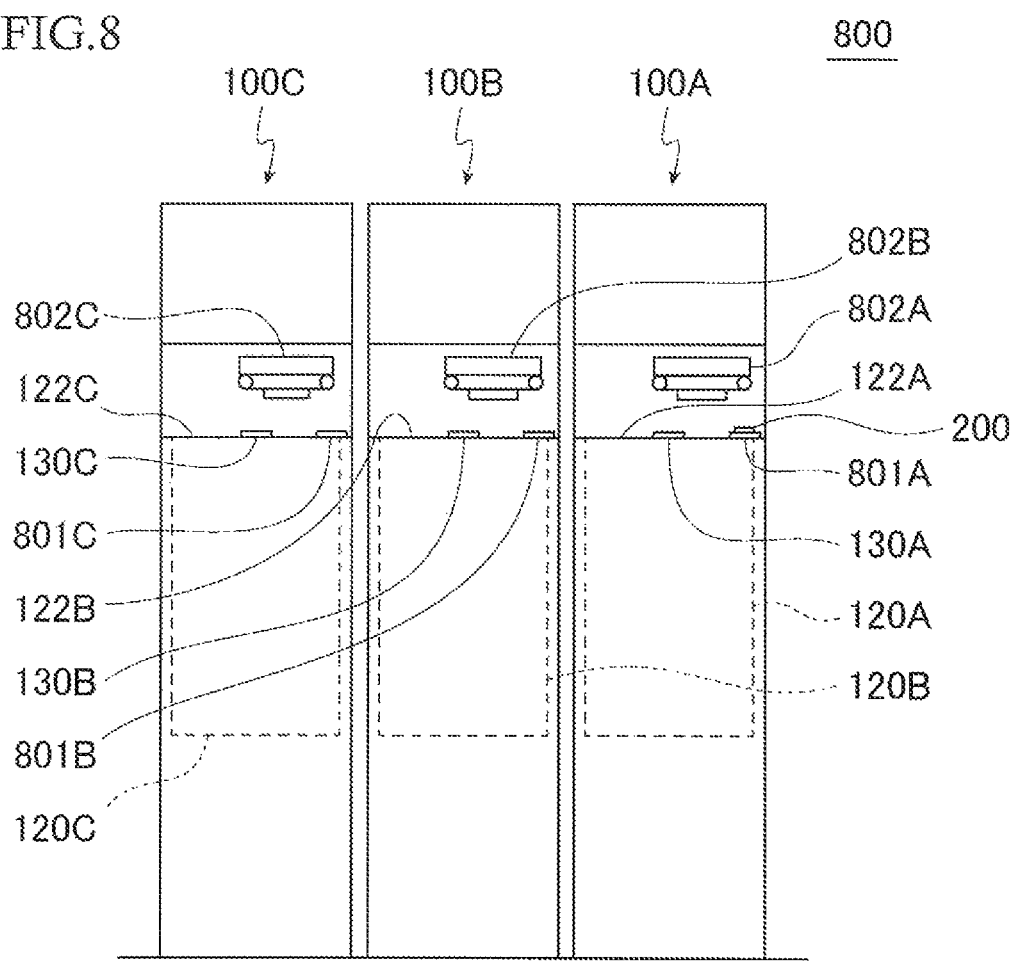
FIG. 8 is a conceptual view showing a configuration of a manufacturing system using a compact semiconductor manufacturing apparatus according to Embodiment 1 of the invention.

FIG. 8 shows an example in which a semiconductor manufacturing system 800 is built using three compact semiconductor manufacturing apparatuses.

As shown in FIG. 8, top plates 122A, 122B, 122C are provided in apparatus antechambers 120A, 120B, 120C of compact semiconductor manufacturing apparatuses 100A, 100B, 100C, respectively, and container placing tables 130A, 130B, 130C are provided on the top plates 122A, 122B, 122C, respectively. Further, in order to automatically transport the wafer transport container 200 among the compact semiconductor manufacturing apparatuses 100A, 100B, 100C, temporary trays 801A, 801B, 801C are provided on the top plates 122A, 122B, 122C of the compact semiconductor manufacturing apparatuses 100A, 100B, 100C, respectively, and container transport mechanisms 802A, 802B, 802C are arranged above the top plates 122A, 122B, 122C.

It should be noted that an automatic clamping mechanism similar to the automatic clamping mechanism 140 of FIG. 1 is mounted in each of the compact semiconductor manufacturing apparatuses 100A, 100B, 100C of the semiconductor manufacturing system 800, but is omitted in FIG. 8.

In such a semiconductor manufacturing system 800, for example, the container transport mechanism 802A grasps the wafer transport container 200 placed on the temporary tray 801A and raises and transfers the wafer transport container 200 to the container placing table 130A. Then, as described above, the wafer transport container 200 is pressed and secured to the container placing table 130A by the automatic clamping mechanism which is not shown. The pressing and securing timing may be, for example, a timing at which a determination is made that the transportation by the container transport mechanism 802A has been completed, or a timing at which a sensor (not shown) provided on the container placing table 130A detects that the wafer transport container 200 has been placed.

Thereafter, when the processing for the semiconductor wafer 300 has been completed and the semiconductor wafer 300 is again stored in the wafer transport container 200, the securing of the wafer transport container 200 by the automatic clamping mechanism is released as described above. The timing of releasing the securing may be, for example, a timing at which a determination is made that the semiconductor wafer 300 has been stored again in the wafer transport container 200, or a timing at which the container transport mechanism 802A starts the next transfer operation.

Subsequently, the container transport mechanism 802A grasps and raises the wafer transport container 200 and transfers the wafer transport container 200 to the temporary tray 801B of the compact semiconductor manufacturing apparatus 100B.

Since the operations of the compact semiconductor manufacturing apparatuses 100B and 100C are similar to the operation of the compact semiconductor manufacturing apparatus 100A, the descriptions thereof will be omitted.

As described above, according to Embodiment 1, by moving the pair of clamping claws 141 in the substantially horizontal direction and pressing the inclined contact surface 202a of the wafer transport container 200 substantially horizontally from both sides, a press force component in the vertical direction is generated at the wafer transport container 200, and the wafer transport container 200 can be secured by this force. Moreover, by moving the clamping claws 141 in the substantially horizontal direction to separate from the inclined contact surface 202a of the wafer transport container 200, the securing to the container placing table 130A can be released. Thus, according to Embodiment 1, it is possible to reduce the height dimension and downsize the automatic clamping mechanism 140, and it is also possible to provide the automatic clamping mechanism 140 at low cost by simplifying the structure of the automatic clamping mechanism 140.

Moreover, according to Embodiment 1, since the inclined contact surface 202a of the wafer transport container 200 is used, the structure for generating the press force component in the vertical direction is compact and inexpensive.

Furthermore, according to Embodiment 1, the securing of the wafer transport container 200 and the sealing of the opposing surfaces of the wafer transport container 200 and the container placing table 130 can be simultaneously carried out using the plurality of clamping claws 141.

In addition, according to Embodiment 1, since the clamping claws 141 are moved substantially horizontally using the link mechanism 420, it is possible to reduce the height dimension and downsize the automatic clamping mechanism 140, and it is also possible to provide the automatic clamping mechanism 140 at low cost by simplifying the structure of the automatic clamping mechanism 140.

What is claimed is:

1. A clamping mechanism mounted to a semiconductor manufacturing apparatus the clamping mechanism comprising:
    clamping claws; and
    a clamping control mechanism configured to move the clamping claws in a horizontal direction toward a transport container containing a semiconductor wafer and placed on a table in a chamber of the semiconductor manufacturing apparatus so that
        the clamping claws horizontally press upper edges of sides of the transport container,
        press force components in a vertical direction are generated by the horizontal pressing by the clamping claws,
        the press force components in the vertical direction press the transport container in the vertical direction to secure the transport container to the table, and press force components in a horizontal direction, opposite each other, are generated by the horizontal pressing by the clamping claws, and cancel each other.

2. The clamping mechanism according to claim 1, wherein after the transport container is secured to the table, the semiconductor wafer is positioned to be removed from the transport container, then processed by the semiconductor manufacturing apparatus, and then returned by the semiconductor manufacturing apparatus to the transport container, and after the semiconductor wafer is returned to the transport container, the clamping control mechanism is configured to separate the clamping claws from the upper edges of the sides of the transport container by moving the clamping claws in a horizontal direction away from the transport container.

3. The clamping mechanism according to claim 1, wherein the upper edges of the sides of the transport container are inclined surfaces of the transport container, and the press force components in the vertical direction are generated by the clamping claws horizontally pressing on the inclined surfaces.

4. The clamping mechanism according to claim 1, wherein the press force components in the vertical direction cause the transport container to be pressed against an O-ring on the table so that the O-ring seals opposing surfaces of the transport container and the table.

5. The clamping mechanism according to claim 1, wherein the clamping control mechanism comprises:

a link mechanism including:

a substantially L-shaped first arm having a first clamping claw of the clamping claws at a first end of the first arm, and capable of horizontally moving the first clamping claw in the horizontal direction toward the transport container and in a horizontal direction away from the transport container; and a second arm having a first end rotatably connected to a vicinity of a second end of the first arm, and being rotatable about a rotation shaft provided at a substantially central portion of the second arm, and having a second clamping claw of the clamping claws on a second end of the second arm, wherein the link mechanism is configured so that, when the first clamping claw comes into contact with an upper edge of a side of the transport container, the second clamping claw comes into contact with an upper edge of a different side of the transport container.

6. A clamping mechanism mounted to a semiconductor manufacturing apparatus, the clamping mechanism comprising:

clamping claws; and a plurality of links to move the clamping claws in a horizontal direction toward inclined upper edges of a transport container containing a semiconductor wafer and placed on a table in a chamber of the semiconductor manufacturing apparatus so that the clamping claws horizontally press the inclined upper edges of the transport container, press force components in a vertical direction are generated by the horizontal pressing of the inclined upper edges by the clamping claws, the press force components in the vertical direction press the transport container in the vertical direction to secure the transport container to the table, and press force components in a horizontal direction, opposite to each other, are generated by the horizontal pressing of the inclined upper edges by the clamping claws, and cancel each other.

7. A semiconductor manufacturing apparatus comprising:

a chamber;

a table in the chamber on which a transport container containing a semiconductor wafer is placeable;

clamping claws; and a clamping control mechanism configured to, with the transport container placed on the table, move the clamping claws in a horizontal direction toward the transport container so that the clamping claws horizontally press upper edges of sides of the transport container, press force components in a vertical direction are generated by the horizontal pressing by the clamping claws, the press force components in the vertical direction press the transport container in the vertical direction to secure the transport container to the table, and press force components in a horizontal direction, opposite to each other, are generated by the horizontal pressing by the clamping claws, and cancel each other.

8. The semiconductor manufacturing apparatus according to claim 7, wherein the semiconductor manufacturing apparatus is configured to, after the transport container is secured to the table, remove the semiconductor wafer from the transport container, process the removed semiconductor wafer, and return the processed semiconductor to the transport container secured on the table, and the clamping control mechanism is configured to, after the processed semiconductor wafer is returned to the transport container, separate the clamping claws from the upper edges of the sides of the transport container by moving the clamping claws in a horizontal direction away from the transport container.

9. The semiconductor manufacturing apparatus according to claim 7, wherein the upper edges of the sides of the transport container are inclined surfaces of the transport container, and the press force components in the vertical direction are generated by the clamping claws horizontally pressing on the inclined surfaces.

10. The semiconductor manufacturing apparatus according to claim 7, further comprising:

an O-ring on the table, wherein the press force components in the vertical direction cause the transport container to be pressed against the O-ring so that the O-ring seals opposing surfaces of the transport container and the table.

11. The semiconductor manufacturing apparatus according to claim 7, wherein the clamping control mechanism comprises:

a link mechanism including:

a substantially L-shaped first arm having a first clamping claw of the clamping claws at a first end of the first arm, and capable of horizontally moving the first clamping claw in the horizontal direction toward the transport container and in a horizontal direction away from the transport container; and a second arm having a first end rotatably connected to a vicinity of a second end of the first arm, and being rotatable about a rotation shaft provided at a substantially central portion of the second arm, and having a second clamping claw of the clamping claws on a second end of the second arm, wherein the link mechanism is configured so that, when the first clamping claw comes into contact with an upper edge of a side of the transport container, the second clamping claw comes into contact with an upper edge of a different side of the transport container.

\* \* \* \* \*